US00RE38025E

(19) United States
(12) Reissued Patent
Skunes et al.

(10) Patent Number: US RE38,025 E
(45) Date of Reissued Patent: Mar. 11, 2003

(54) HIGH PRECISION COMPONENT ALIGNMENT SENSOR SYSTEM

(75) Inventors: Timothy A. Skunes, Columbia Heights, MN (US); Steven K. Case, St. Louis Park, MN (US); Curtis J. Bocchi, Minnetonka, MN (US)

(73) Assignee: CyberOptics Corporation, Minneapolis, MN (US)

( * ) Notice: This patent issued on a continued prosecution application filed under 37 CFR 1.53(d), and is subject to the twenty year patent term provisions of 35 U.S.C. 154(a)(2).

(21) Appl. No.: 08/556,028

(22) Filed: Nov. 13, 1995

Related U.S. Patent Documents

Reissue of:
(64) Patent No.: 5,278,634
Issued: Jan. 11, 1994
Appl. No.: 07/659,983
Filed: Feb. 22, 1991

(51) Int. Cl.[7] ..... G01B 11/00
(52) U.S. Cl. ..... 356/400
(58) Field of Search ..... 356/375, 376, 356/399–401; 250/559.22, 559.24, 559.26, 559.27, 559.29, 559.34, 559.35, 559.36, 559.37; 29/407; 414/786–787; 901/47

(56) References Cited

U.S. PATENT DOCUMENTS

| | | | |
|---|---|---|---|
| 3,487,226 A | | 12/1969 | Yetter et al. |
| 3,764,813 A | | 10/1973 | Clement et al. |
| 3,854,052 A | * | 12/1974 | Asar et al. |
| 3,876,877 A | | 4/1975 | Meulensteen et al. |
| 3,888,362 A | | 6/1975 | Fletcher et al. |
| 4,144,449 A | | 3/1979 | Funk et al. |
| 4,151,945 A | | 5/1979 | Ragard et al. |
| 4,247,767 A | | 1/1981 | O'Brien et al. |

(List continued on next page.)

FOREIGN PATENT DOCUMENTS

| | | |
|---|---|---|
| DE | 28 34 836 | 8/1978 |
| DE | 30 22 803 | 4/1981 |

(List continued on next page.)

OTHER PUBLICATIONS

Brozinski, "SMD–Automatic from Europeans for Europeans".*

(List continued on next page.)

*Primary Examiner*—Frank G. Font
*Assistant Examiner*—Layla Lauchman
(74) *Attorney, Agent, or Firm*—Dicke, Billig & Czaja, P.A.

(57) ABSTRACT

A high speed high precision laser based alignment sensor system for use on surface mount component placement machines. A laser system is utilized to correctly align and position component parts which range between 0.02 inches and 2.0 inches in size. The laser sensor system consists of a laser light source which is passed through a collimating lens and then through an aperture to create a stripe of collimated laser light which is focused past the component being aligned to strike a multi-element CCD sensor array. The sensor system is mounted directly on the carrying mechanism for the surface mount component placement machine. During transit of the component between the bin of components is to be placed, the component is rotated and the shadow which falls on the detector array is monitored. When the minimum width of shadow is detected, the correct angular orientation is determined, the average of the edges of the shadow when compared with the center of the quill determines the coordinate (X,Y) location of the component on the quill. Two alignments normally occur displayed by 90°. Thereafter, the sensor sends correcting signals to the component placement machine to assure the correct angular orientation and the correct X,Y position for the component to be placed on the circuit board by the component placement machine.

54 Claims, 6 Drawing Sheets

U.S. PATENT DOCUMENTS

| | | | | | |
|---|---|---|---|---|---|
| 4,312,109 | A | | 1/1982 | Kawana et al. | |
| 4,346,293 | A | | 8/1982 | Fetzer | |
| 4,405,233 | A | | 9/1983 | Grau | |
| 4,424,588 | A | | 1/1984 | Satoh et al. | |
| 4,598,456 | A | | 7/1986 | McConnell | |
| 4,615,093 | A | * | 10/1986 | Tews et al. | |
| 4,706,379 | A | | 11/1987 | Seno et al. | |
| 4,733,969 | A | | 3/1988 | Case et al. | |
| 4,741,621 | A | * | 5/1988 | Taft et al. | 356/376 |
| 4,747,198 | A | | 5/1988 | Asai et al. | |
| 4,776,088 | A | | 10/1988 | Biggs et al. | |
| 4,794,689 | A | | 1/1989 | Seno et al. | |
| 4,805,110 | A | | 2/1989 | Takahashi et al. | |
| 4,881,319 | A | | 11/1989 | Yagi et al. | |
| 4,891,772 | A | | 1/1990 | Case et al. | |
| 4,905,370 | A | | 3/1990 | Hineno et al. | |
| 4,973,216 | A | | 11/1990 | Domm | |
| 5,012,115 | A | | 4/1991 | Asai et al. | |
| 5,030,839 | A | | 7/1991 | van de Stadt | |
| 5,035,047 | A | | 7/1991 | Harigane et al. | |
| 5,040,291 | A | | 8/1991 | Janisiewicz et al. | |
| 5,046,851 | A | * | 9/1991 | Morgan | 356/375 |
| 5,060,366 | A | | 10/1991 | Asai et al. | |
| 5,088,187 | A | | 2/1992 | Takata et al. | |
| 5,131,139 | A | | 7/1992 | Oyama et al. | |
| 5,901,241 | A | | 5/1999 | Koljonen et al. | |
| 6,031,242 | A | | 2/2000 | Hudson | |

FOREIGN PATENT DOCUMENTS

| | | | | |
|---|---|---|---|---|
| EP | 0 062 335 A2 | | 10/1982 | |
| EP | 0 144 717 B1 | | 10/1988 | |
| EP | 0 293 175 A3 | | 11/1988 | |
| EP | 0 374 848 A3 | | 6/1990 | |
| GB | 2183820 | * | 6/1987 | 356/375 |
| JP | 57-17804 | * | 1/1982 | |
| JP | 60-183507 | * | 9/1985 | |
| JP | 61-225604 | * | 10/1986 | |
| JP | 62-8006 | * | 1/1987 | |
| JP | 62-263405 | | 11/1987 | |
| JP | 62-288504 | * | 12/1987 | |
| JP | 63-202096 | * | 8/1988 | |
| JP | 63-283100 | | 11/1988 | |
| JP | 63-299400 | | 12/1988 | |
| JP | 2-59231 | | 2/1990 | |
| JP | 2-62099 | | 3/1990 | |
| JP | 2303751 | * | 12/1990 | |
| JP | 3-45919 | | 7/1991 | |
| JP | 4-322924 | | 11/1992 | |

OTHER PUBLICATIONS

Sanderson, Arthur C., et al., "Sensor–Based Robotic Assembly Systems: Research and Applications in Electronic Manufacturing," Proceedings of the IEEE, vol. 71, No. 7, Jul. 1983, pp. 856–871.

Weissmantel, H., "Montage mit Robotern," VDI–Berichte Nr. 460, 1982, pp. 63–68 (German), (translation of title: "Assembly Using Robots"); and English translation.

European Patent Office "Patent Abstracts of Japan" abstract for JP60–189951. Abstract only Feb. 7, 1986.

"New Trends in SMD Pick & Place Machines Put High Demands on Vision Systems", IECON '90, 16th Annual Conference of IEEE Industrial Electronics Society, Nov. 27–30, 1990, pp. 799–804.

German Publication "Die Fachneitschrift fur Elektronik Fortigung und Test", 1990.*

* cited by examiner

HIGH PRECISION COMPONENT ALIGNMENT SENSOR SYSTEM

Matter enclosed in heavy brackets [ ] appears in the original patent but forms no part of this reissue specification; matter printed in italics indicates the additions made by reissue.

BACKGROUND OF THE INVENTION

The invention relates to control system which precisely align electrical components, both as to angular orientation and coordinate (X,Y) location for precise placement via pick-and-place systems such as surface mount component placement machines. More specifically, the invention relates to a non-contact laser based sensor system which precisely determines and allows a pick-and-place system to connect the angular orientation of a component and the coordinate positioning of the component for precise placement of the component by a component placement machine on a circuit board or other work surface.

There are two types of component placement machines in common use today, one of which is a cartesian system where one or more vacuum quills are used to travel to a bin, pick up a component, properly orient the component and carry it to a circuit board or other work piece to precisely place the component in its proper location with the leads making proper contact with the circuit connections which are subscribed on the circuit board or work place. Another type of placement system in use is a carousel or turret placement system where components are picked up from the bin and stepped through stations located around the perimeter of a circular component carrying mechanism for placement on the circuit board. It is believed that the present invention will be most useful with cartesian systems which must accurately place components with the highest degree of speed and accuracy.

The electrical components must be placed precisely on the circuit board, to ensure proper electrical contact, thus requiring correct angular orientation and lateral positioning. Angular orientation and lateral positioning are most commonly achieved today through mechanical means. A vacuum quill picks up the part to be placed. During travel between the component bins and the circuit board, four jaws or hammers, which are suspended from the fixturing device, travel downwardly and strike the component on all four sides with substantially equal force. The intent of such a mechanical system is to shift the component on the vacuum quill so it achieves the correct angular orientation, 0 degrees deviation, and also to center it on the vacuum quill. The striking of such components can cause damage such as microcracking and other such components. It is also extremely difficult to achieve the very high degree of accuracy both as to angular orientation and lateral position that is required by the design rules in use in today's technology where lead spacing and widths are only 10–25 mils wide. To accommodate different component sizes, six different sizes of jaws may be required which can lead to high expense.

A number of non-contact higher precision methods have been proposed. However, light based systems of the past have had difficulty in achieving the high speed and high accuracy which is required for today's technology.

Vision based systems using a TV camera are capable of achieving high accuracy. However, they are one of the most expensive of systems proposed and they require a deviation in the path of the quill from the bin to the TV station, and then to the work piece or circuit board which substantially slows the process. The laser sensor of the instant invention is connected in a manner to surround the component carrying quill which transports the component directly, without deviation, to the appropriate site on the circuit board to achieve a time saving of approximately a factor of two. In addition, it is sometimes difficult to distinguish the particular parameters of very small components being placed by such systems from the quill upon which the components are mounted.

Light sensing systems have also been proposed where a component is interposed in the light path of a collimated beam of light and the intensity of the light is detected by a single photodetector or a pair of photodetectors with a maximum light intensity indicating the narrowest shadow and thus proper angular orientation of the component. However, it is difficult for such systems to handle the range of components that are placed and to achieve the accuracy required for alignment. The dimensions of components to be placed normally vary between 0.02 inch and 2.0 inches. If a single photodetector system is designed large enough to detect shadow variations for a 2.0 inch part, as it must be, the fractional variation caused by rotation of a 0.02 inch part has such little effect on the total light intensity that it is virtually undetectable. For two detector systems, the component part must be precisely aligned between the two detectors with the ratio of light falling on each detector being analyzed to determine edge positions. However, it is extremely difficult to mechanically align photodetectors to make such a measurement. The uniformity of light must be precise and such a system cannot detect component lead positions since shadows of the leads are not distinguishable from shadows of the body of the component.

Finally, it has also been proposed that a series of laser light sources be aligned with a series of laser light detectors. Such a design overcomes some of the problems associated with the proposals for a single detector or pair of detectors. However, the degree of accuracy that can be achieved can be no more than the spacing of the individual laser sources one from the other. The minimum spacing would be given by the size of a laser diode source, which is 0.5 millimeter. This minimum spacing still would be too large for reliable component position detection. The required physical spacing will also be negatively affected by diffraction effects to further limit accuracy of such a design. Also, it is believed that the cost of such a system involving many laser sources would also be prohibitively expensive.

What is needed to achieve component placement for current technology is a component system which can rapidly, in a few hundred milliseconds, align a range of parts varying between 0.02 inches and 2.0 inches with an angular orientation accuracy of less than 0.03° and with lateral position accuracy of better than 0.001 inches. The present invention is specifically addressed to this current need.

SUMMARY OF THE INVENTION

The present invention is a laser based system designed to accurately align component parts which range in size from 0.02 and 2.0 inches. To achieve this result, an extremely high speed high accuracy laser based system is secured to the moving placement mechanism. The sensor system includes a laser diode, the light from which is collimated with a collimating lens and passed through a slit aperture. This provides a stripe of laser light which passes by an is blocked by the component whose alignment is being sensed. The shadow can by the component is detected by a linear array detector. Typical spacing between detector elements is 10–14 micrometers. The number of detector elements is chosen to accommodate the largest component to be placed. Data read from the detector array is analyzed to detect the leading edge and the trailing edge of the shadow which is cast upon the detector array. Since only the shadow edges are detected and analyzed, the same degree of accuracy is achieved when aligning a 0.02 inch part as is achieved when aligning a 2.0 inch part. Using data processing algorithms described below, angular orientation can be achieved at much less than 0.03 degrees and lateral alignment can be achieved with an accuracy of less than 0.001 inch.

It is also possible to detect not only the orientation and lateral positioning of the component body, but also the electrical leads from the component body which are the actual elements which must be precisely aligned on the circuit board upon which the component is to be placed.

It is an object of the invention to accurately and precisely determine angular orientation and lateral position of components for placement by a component placement machine.

It is an object of the invention to accurately determine angular orientation of a component to be placed by a component placement machine with an accuracy of better than 0.03 degrees.

It is an object of the invention to determine lateral position of a component to be placed by a component placement machine to an accuracy of better than 0.001 inch.

It is an object of the invention to determine angular orientation and lateral placement of a component to be placed by a component placement machine in less than 500 milliseconds.

It is an object of the invention to accurately determine the angular orientation and lateral position of leads on a component which is to be placed by a component placement machine.

It is an object of the invention to determine angular orientation with a degree of accuracy of greater than 0.03 degrees and lateral position to an accuracy of greater than 0.001 inch for a range of component varying in size from 0.02 inch to 2.0 inch.

These and other objects, features and advantages of the invention will become obvious to those skilled in the art upon a review of the following description of the preferred embodiment, the drawings and claims appended thereto.

DESCRIPTION OF THE DRAWINGS

As shown in FIG. 4, the laser beam is directed to a pair of reflecting mirrors through a collimating lens, past the part, through an optical filter and on to the linear CCD array.

FIG. 5 illustrates how the optical path between the laser and collimating lens is folded and hence put into a smaller package via a pair of folding mirrors.

FIG. 7 shows the broad shadow that is cast from corner to corner of the component part. Illustrated above the linear array of FIG. 7 is representative data from the linear array.

As shown in FIG. 10, a discriminator is used to determine when the data falls below a threshold voltage. The discriminator converts the analog data to a digital representation which can then be used to establish angular orientation and edge positions of the component. Illustrated in FIG. 10 are the data points which are identified with the leading edge and trailing edge of the shadow. Also illustrated on the right side of FIG. 10 is a determination of the lead position which can also be discriminated and converted to a digital representation of the lead alignment.

FIG. 12a illustrates how a part larger than 2 inches can be aligned and positioned via off-center mounting of the detector relative to the component. FIG. 12b shows the use of additional optical elements to reduce the image of a larger part so that the image can be cast on a detector smaller than the component. FIG. 12c shows the use of additional optical elements to enhance the resolution of the measurements.

DESCRIPTION OF THE PREFERRED EMBODIMENT

Figure 1:
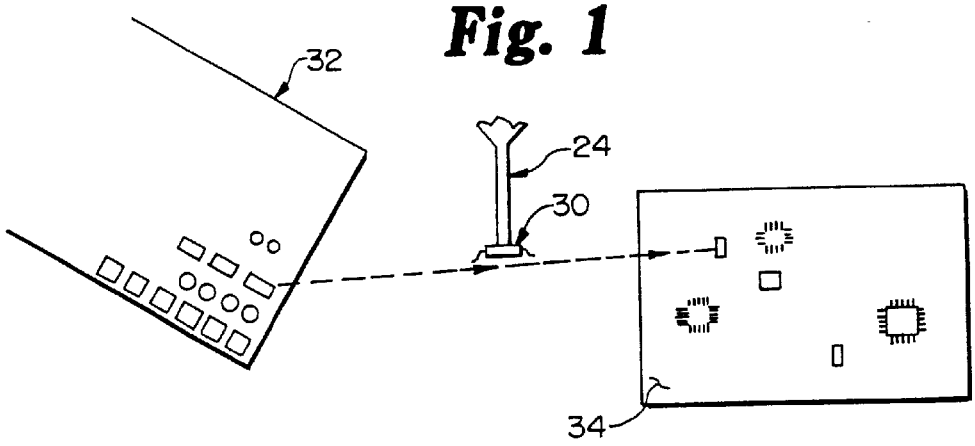
FIG. 1 is a plan view showing the environment of the invention. Shown in FIG. 1 is a component bin which contains components which are placed by the component placement machine on a circuit board or work piece. Also shown in FIG. 1 is a component being carried by a quill in the shortest route possible between the component bin and the work piece.
Figure 2:
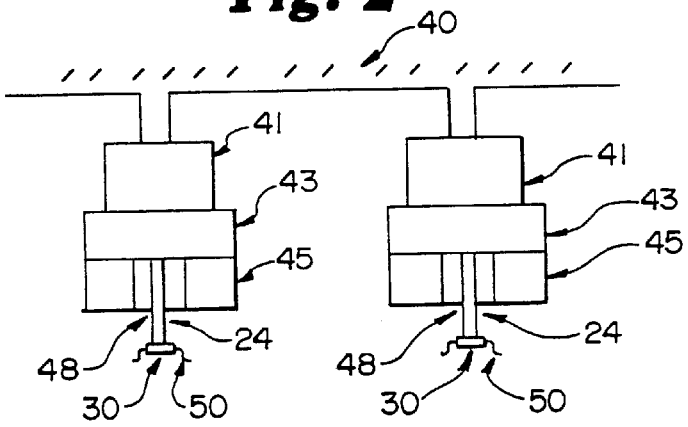
FIG. 2 is an elevational view showing in greater detail the component carrying mechanism which includes a rotary motor for rotating the component, a placement head control box and a laser alignment sensor. Extending through the laser alignment sensor is the vacuum quill which holds the components.

FIGS. 1 and 2 illustrate the general environment in which the invention is to be used. FIG. 1 illustrates in diagram form a typical surface mount component placement machine in which one or more vacuum quills 24 are used to sequentially pick up components 30 from predetermined bins 32, transport them as quickly as possible to a circuit board 34 or other surface upon which the component must be precisely aligned, and place the component 30 accurately at the desired location with the proper alignment of the leads 50 of the component 30 to a wiring layout which has been previously created on the circuit board 34. For high precision placement, an accuracy in angular alignment or orientation of 0.30 degress with positioning error in the X,Y plane of 0.001 inch is required. Component 30 part sizes typically employed in such a system vary between approximately 20 thousands of an inch in size in two inches in size, although in certain cases larger component 30 sizes are required.

Angular orientation is important because of the effect misorientation has on placement of the electrical leads. For the largest component size (e.g. 2 inches) a deviation of 0.10 degrees causes the lead positions at the outer edge of the component to be canted or misplaced by approximately 0.002 inches. It is for this reason that alignment accuracy of 0.03° is an object of the invention.

Referring to FIG. 2, the component carrier mechanism 40 is disclosed which includes a rotary motor 41, and placement head control box 43 including a fixturing device for holding, rotating and retracting the vacuum quill 24. The rotating fixture rotates the quill for purposes of component 30 pickup, alignment, positioning and placement. Also represented in FIG. 2 are the laser sensors 45 and components 30, the proper placement of which is the subject of this invention.

In the component control box 43, which is of conventional design, are means for retracting the quill to which the component 30 is attached by vacuum pressure, comprising servomotors, a means to create the vacuum to hold the component to the end of the quill 24, angular position encoders, force sensors force sensors and the like. Attached to the control box 43 is the laser based alignment sensor 45 which has an aperture 48 therein through which the quill 24 extends and into which the component 30 can be retracted for determination of its angular orientation and for alignment with the center of the quill 24.

Figure 3:
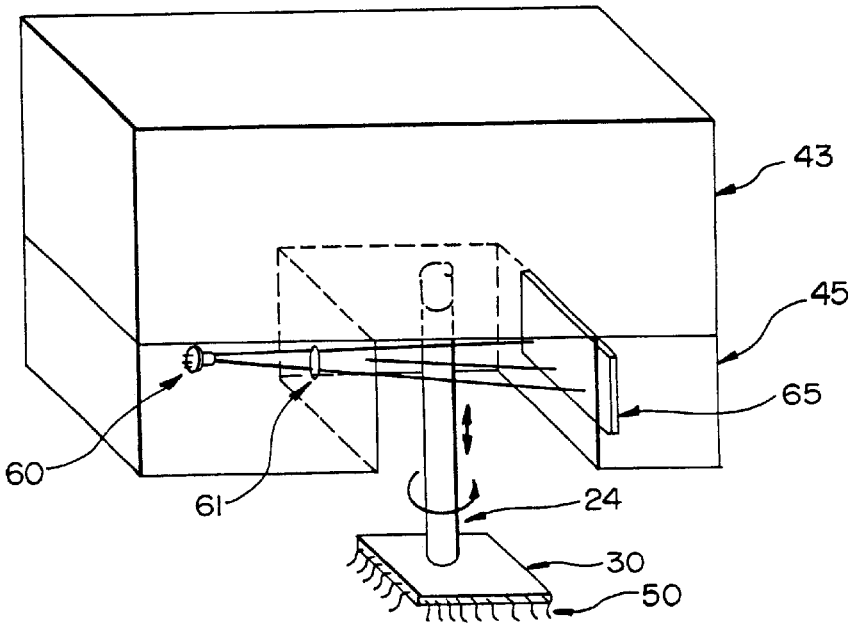
FIG. 3 is an illustration of the basic elements of the invention which include a laser diode and a collimating lens which causes the light beam or stripe to pass across the component to strike a linear array image sensor. For alignment, the component part is retracted into the laser beam and rotated for measurement.
Figure 4:
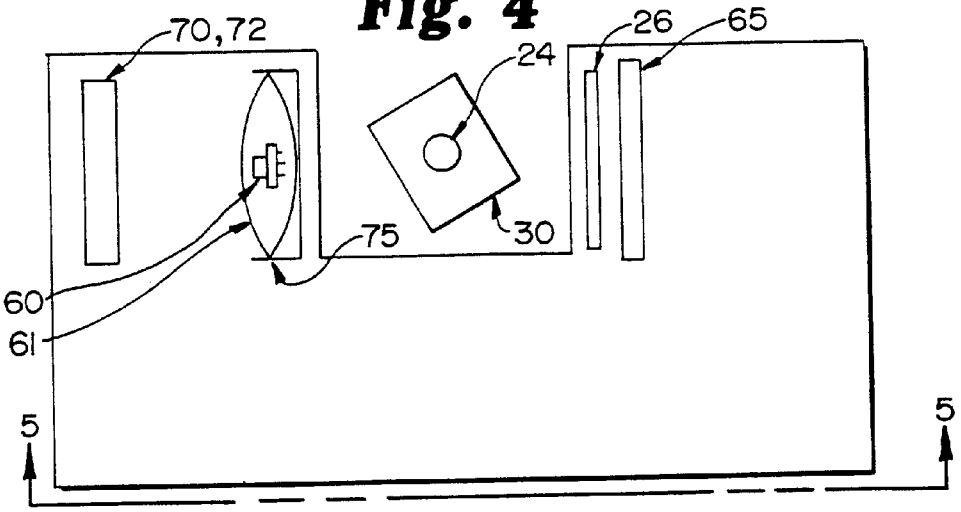
FIG. 4 shows a top plan view of a preferred embodiment of the invention.
Figure 5:
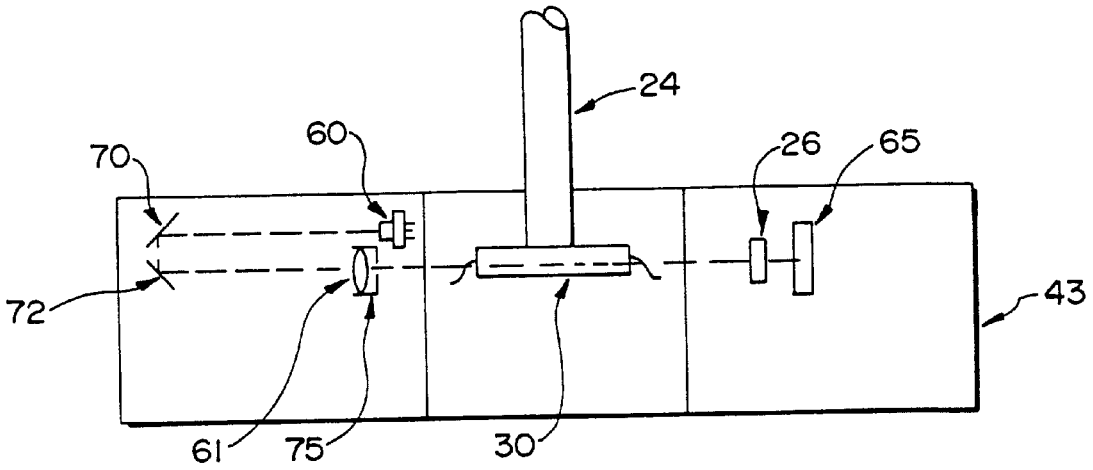
FIG. 5 is a sectional side view of the laser sensor of FIG. 4 taken along the line 5—5.

FIG. 3 is a schematic representation of the components of the laser sensor 45. For ease of discussion, a line of sight representation is shown from the laser 60 through a collimating lens 61 past the component 30 and quill 24 to the linear array image sensor 65. In actual practice, a longer focal length is desired and FIGS. 4 and 5 more accurately represent the actual orientation of a preferred embodiment of the laser 60 and other components. In other words, a shown in FIGS. 4 and 5, a preferred embodiment would include a laser diode 60 directed away from the part, two reflecting mirrors 70,72 directing the laser light beam through the collimating lens 61 and a slit orifice 75 past the part 30 with that portion of the laser beam or stripe which passes the edge of the component 30 being filtered by optical filter 26 to strike the linear CCD array 65 to provide the data which is to be processed for angular orientation and X,Y location. It is also possible to use a single reflecting parabolic lens (not shown) in place of the mirrors 70,72

Figure 6:
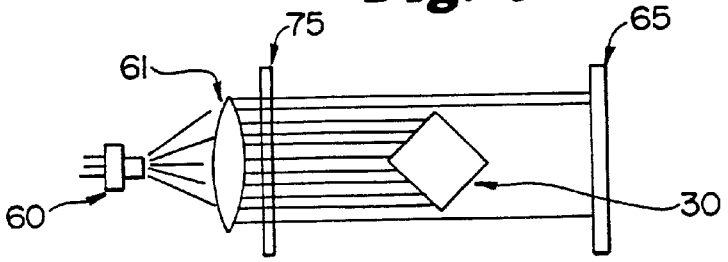
FIG. 6 is a schematic illustration of the laser light paths from the laser diode through the collimating lens which distributes the light across the measurement area through a slit aperture to create the stripe of light and on to and past the component part to strike the detector array.
Figure 7:
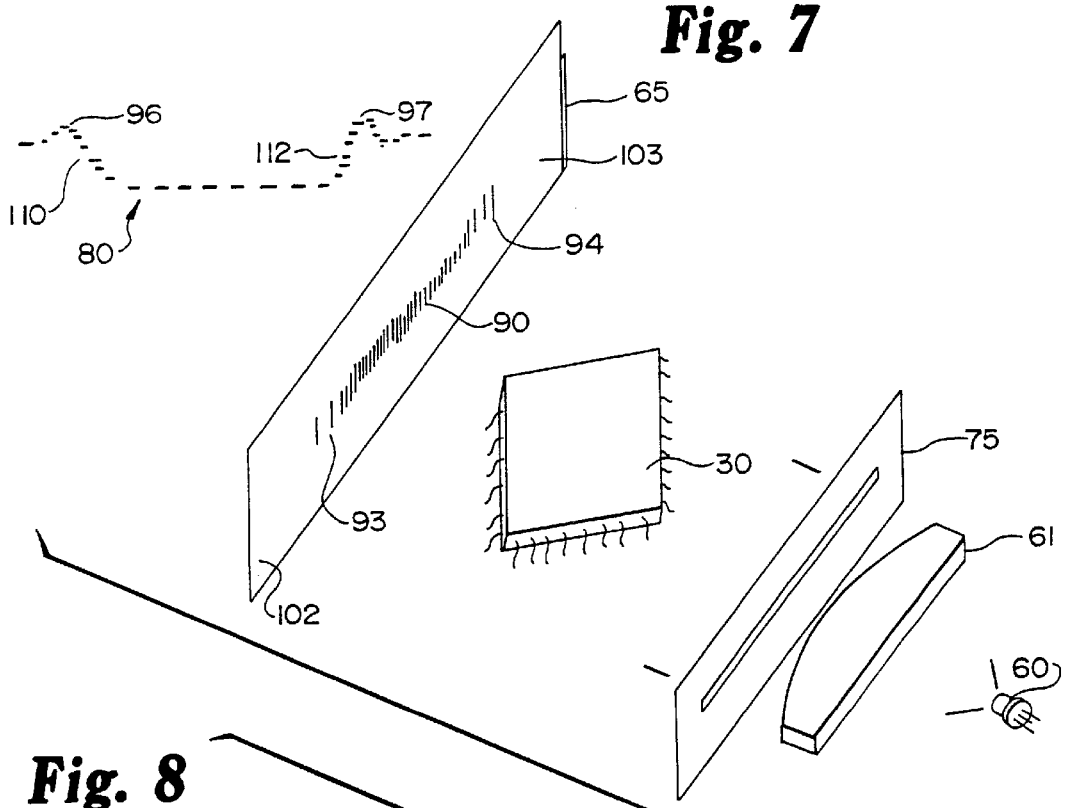
FIG. 7 is an illustration of the elements of FIGS. 6 when the component part is mis-oriented.
Figure 8:
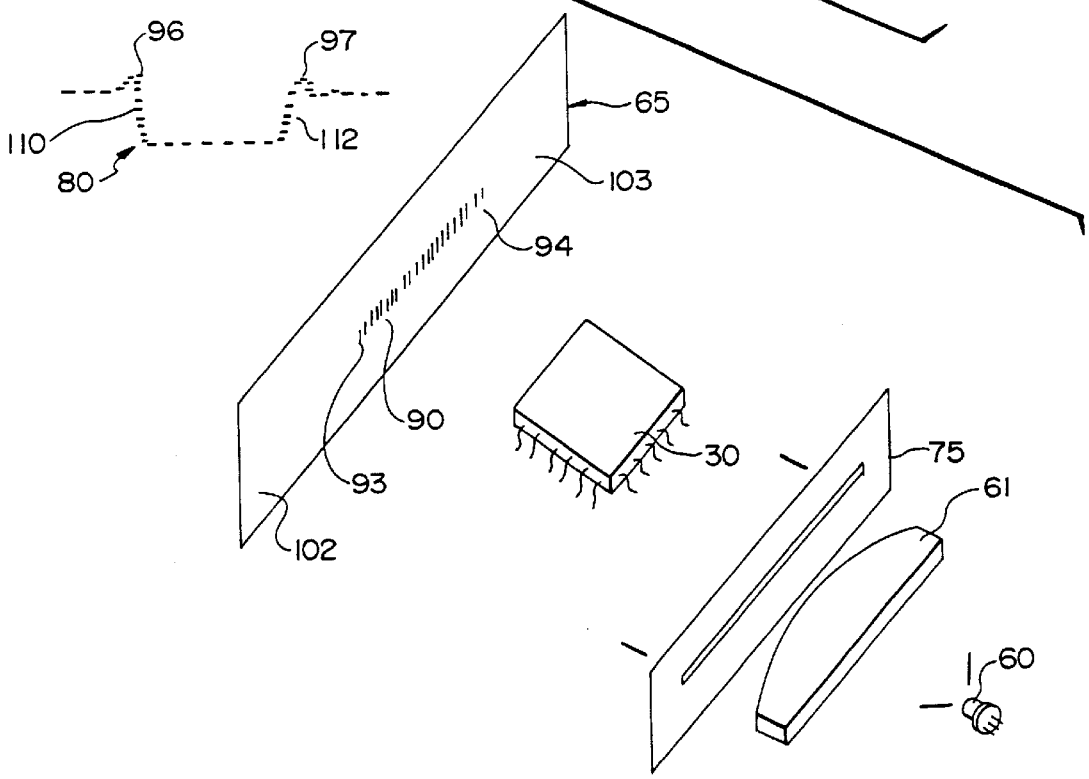
FIG. 8 shows the same components and elements of FIG. 7 when the component is in alignment. As noted, the shadow or dark portion which is cast upon the linear array is narrower than that in FIG. 7. The corresponding data from the CCD array shows the narrowing of the shadow as well.
Figure 9:
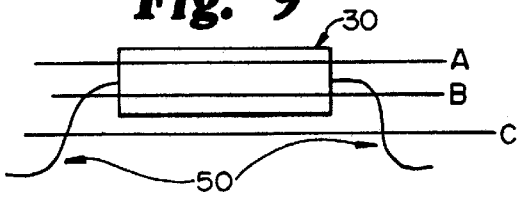
FIG. 9 shows a component and the laser stripe across the component. The laser stripe can be positioned to read the body only, both leads of the compound and the body, or only the leads of the component part.

FIGS. 6 through 8 further illustrate diagramatically the components of the laser based component alignment sensor 45 for surface mount component placement machines and its mode of operation. As diagrammed in FIG. 6, a laser source preferably having a short coherence length is directed, or indirectly through reflecting mirrors 70,72 to a collimating lens 61 to provide equal light to all portions of the component 30. The light pattern cast by the component is detected by the multi-element sensor array 65. A slit aperture 75 is utilized to assure a uniform strip of light (A, B or C in FIG. 9) which is positioned (A) completely across the component 30, or (B) across the component 30 and its leads 50 or, in special circumstances, (C) across the leads 50 themselves as shown in FIG. 9. The light which is not blocked by the component 30 passes the component 30 and strikes a linear CCD detector array 65 such as part no. TC104 manufactured by Texas Instruments Corporation which has 3456 elements, each 10.4 micrometers by 10.4 micrometers configured along a line with center to center spacing of 10.4 micrometers. Interposed between the component 30 and the detector array 65 is the optical filter 76 which is outside of the wavelengths of interest. The data 80 thus captured from the detector array 65 is then processed using one or more of the algorithms which are disclosed in more detail below.

The laser source 60 with shorter coherence length is preferred to lessen the effect of speckle from dust or dirt which might occur if a monochromatic laser diode were used. The use of 3,456 detector array elements enables large parts to be measured. The elements are spaced at approximately 0.4 mil centers which enables high accuracy. Sensitivity to minute changes in angular orientation and lateral position is increased dramatically over prior art devices. This is because, for a given photodetector element near the shadow edge, the fractional change in light level can be very large for very small angular rotations.

Referring now to FIG. 7, the component 30 is shown with its angular orientation out of alignment. As shown in FIG. 7, a relatively large number of detector elements are blocked from the laser because of the angular misorientation of the component 30 creating a shadow 90. In addition, there are small areas of laser shadow 93,94 striking the array 65 created between the bright portion and the dark portion 90 caused by defraction of the light past the edges of the component 30. In addition, minutely brighter portions 96,97 will be detected adjacent to outer edges of the shadow 90 due to diffraction and reflection of light off the outermost edges of the component 30. Illustrated in FIG. 7 is the data pattern 80 of the data which is read from the CCD array 65 showing portions 102,103 of the detector array 65 which receive unblocked light from the laser source 60, and then an increase in light from reflection 96,97, a decreasing amount of light in the shadow area 93,94 caused by refraction, and the dark shadow area 90 with an identical pattern on complimentary sides of the detector array 65. FIG. 8 illustrates the light pattern and the data 80 when the component is in angular alignment.

As will be obvious from a comparison of FIGS. 7 and 8, angular alignment can be assured by determining when the shadow pattern 90 is narrowest as determined by the data 80 from the sensor array 65. This can be achieved with a minimum of electronic processing means by following and determining the leading edge of the shadow and 110 and the trailing edge of the shadow 112 and by capturing only data 80 which proceeds and follows the edges 110,112 of the shadow.

Figure 10:
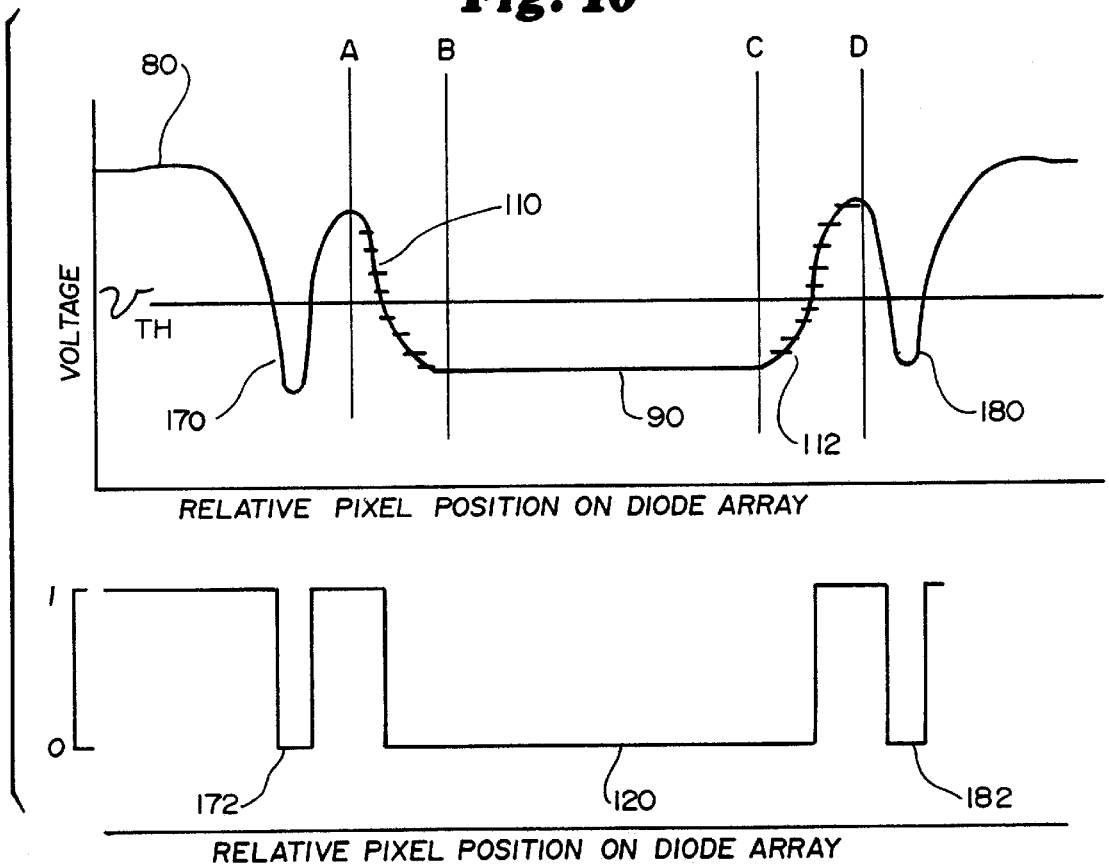
FIG. 10 illustrates diagrammatically one method for achieving angle orientation and lateral position.

FIG. 10 shows a method of processing the data to a high degree of accuracy. The range of part 30 widths which are to be analyzed by the alignment and position sensor 45 normally range from 0.02 to 2 inches and can be larger. It is neither practical nor necessary to retain and analyze all data 80 from the over 3,000 element diode array 65. It is necessary to obtain and analyze only the data 80 which is relevant to the edges 110,112 of the shadow 90 which is cast by the component 30 on the diode array 65. Referring to FIG. 10, there are two zones, A-B, C-D of primary interest, one A-B is the leading edge 110 of the shadow 90 and the other C-D is the trailing edge 112 of the shadow 90. In other words the data is zone A-B defines the edge of the shadow caused by one side of the component, and the zone C-D the edge caused by the opposite side.

Using the defined edges 110,112, as shown in zones A-B and C-D, the part 30 can be aligned. Initially the component 30 is picked up in a position which is known to be misaligned and will, hence, cast a larger shadow 90. The component 30 is then rotated by the component placement head 43 and the angular position at which the shadow 90 width is minimized is noted. The edge positions, when the shadow 90 is narrowest and their deviation from the center of the quill 24 are noted as well. These positions allow calculation of the lateral position of the part. The component can then be rotated 90° and the orthogonal lateral position determined, based again on the comparison of the center of the shadow 90 of the component 30, as determined by the edge 110,112 positions, with the center of the quill 24.

Alternatively a second sensor (not shown) could be used which is orthogonally located relative to the first sensor 45 to determine the orthogonal lateral position.

As the width of the shadow 90 decreases due to the component 30 being rotated into alignment, a particular photodiode element located on the edge 110 of the shadow 90 will receive increasingly more light, until the point at which the shadow 90 width is minimum. As the component continues to rotate, the shadow width increases and the amount of light falling on the same photo element will begin to decrease. Thus, we are able to accurately orient the component 30 parallel to the laser beam by finding the position at which the output from the photo element which is determined to be on the shadow edge is maximum, that is it is receiving the maximum amount of light.

One method which can be used, which is represented in FIG. 10, is the use of a threshold voltage ($V_{TH}$) and a comparator or discriminator which converts the analog data 80 from the diode array 65 to a digital representation 120 by detecting when the voltage on each element of the array 65 falls below the threshold voltage $V_{TH}$ thereby indicating that the shadow 90 of the component 30 has been detected.

Preferably each element in the array 65 is sequentially read at a five megahertz data rate and compared with the threshold voltage $V_{TH}$. The pixel count, where the data 80 reading first fell below the threshold voltage, is used as a latch signal and the number of data readings immediately preceding and immediately following the first occurrence is stored in a data buffer as the leading edge 110 of the shadow. Although any number of data points can be stored, 32 pixels preceding and following the first latch signal (A-B) has been found satisfactory, providing a total of only 128 items of data (A-B, C-D) necessary to analyze the precise angular orientation and lateral position of the component 30.

Similarly, data is read and stored for the trailing edge of the shadow 112 when the data signals first rise above the threshold voltage $V_{TH}$. This data is then stored as the data for the current shadow edge positions.

The quill then incrementally rotates and the next subsequent scan of the data 80 from the diode array 65 is analyzed. Since the data can be read from the array in less than a millisecond and the component 30 rotates through ninety degrees in approximately 150 milliseconds. The rotational movement has a minor effect on accuracy. For fine pitch alignment the part 30 is rotated more slowly through the area where the first pass established the proper angular alignment. On the next subsequent scan, the leading edge 110 of the shadow 90 is again determined by the pixel count of the diode array location where the voltage first dropped below the threshold voltage $V_{TH}$. If the leading edge 110 of the shadow 90 is detected at a higher pixel count, this indicates that the shadow 90 has narrowed and the previous data is ignored and new data is stored which indicates the present location of the shadow 90. The above process is repeated until the narrowest shadow 90 is determined which indicates alignment of the component 30.

Basically, the angular orientation can be determined accurately by a number of algorithms. Proper angle orientation can be established at the angle at which the "edge pixel" intensity is maximized. The above algorithm can also be implemented in binary form as shown in FIG. 10 by using a discriminator and threshold voltage $V_{TH}$. As the shadow 90 narrows, the light falling upon, and, therefore, the voltage read from any certain photo detector elements will rise above the threshold voltage and then, as the component rotates past alignment. fall below the threshold voltage. Using the binary discriminator the angle at which the voltage rose above threshold and the angle at which the voltage fell below threshold can be recorded. Proper alignment can be determined to be midway between the two angles where the voltage, and therefore the light, reached maximum intensity. Multiple "edge pixels" can be analyzed using this binary method to super resolve the angular position.

The leading and trailing edges 110,112 of the package shadow can be computed using digitized analog video data. The proper angle orientation will be established at the point at which the shadow width 90 is minimized. Interpolation can also be used to super-resolve the angular position.

Similar data analysis can be performed to determine the lateral (X,Y) position by similarly applying the analog threshold to the shadow video data. The package width is the distance between the trailing and leading "edge pixels". The package center is located midway between the two edge pixels. It is also possible to add a correction factor to allow for the finite width of the diffraction pattern. When the video signal is digitized, numerous image processing algorithms exist for computing the edge locations. As will be obvious, the part is rotated 90° to locate the lateral positions in the orthogonal direction.

FIG. 10, a discriminator 130 (shown in FIG. 11) is used which can comprise a comparator which compares the data read from the CCD array 65 to the threshold voltage $V_{TH}$. As illustrated in FIG. 10, there will be a number of data points A-B, C-D which, because of diffraction and reflection, will be present on the leading 110 and trailing 112 edge of the shadow 90. However, diffraction and reflection will occur uniformly on both the leading edge and the trailing edge of the shadow and therefore both the angular orientation and the lateral position can be accurately established using this method or algorithm. Data 80 will be collected only in the area A-B of FIG. 10 if the stripe of laser light is positioned at location A shown in FIG. 9. If the stripe is lowered to Position B of FIG. 9, additional data can be collected to establish the location of the leads 50 attached to the compartment 30. This is important since it is the leads 50 which must be placed most accurately. The leads 50 will cause a drop in data below the threshold voltage when one or more detector 65 elements are blocked and such data can also be converted to binary 172, 182 with the discriminator. Thus the precise location of the leads 50 can be ascertained for purpose of placement. In a similar manner, the quill 24 can be retracted further so that the stripe falls only on the leads as shown as position C in FIG. 9. The finest pitch components 320 can thus be accurately placed.

Figure 11:
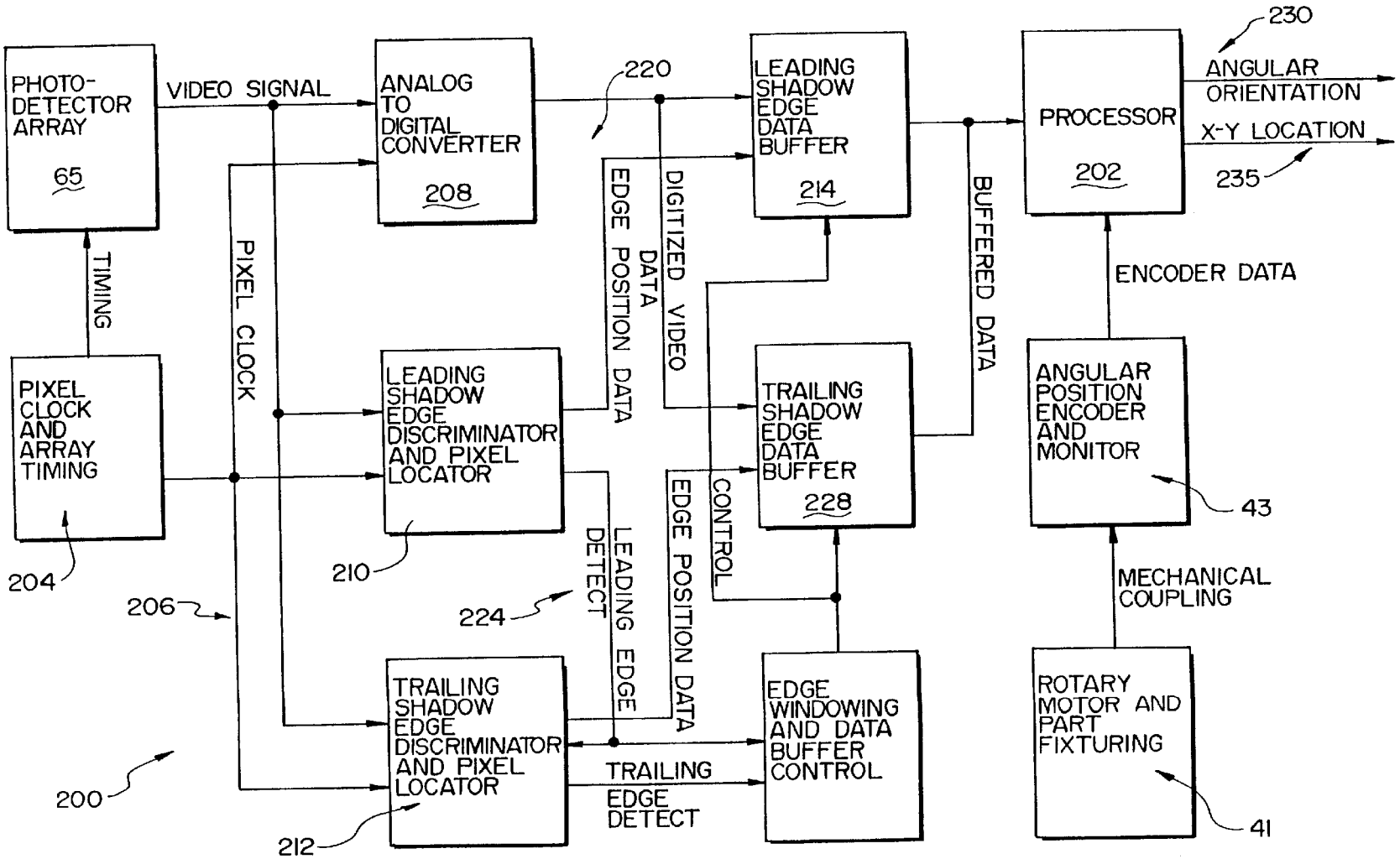
FIG. 11 is a block diagram of the electronic elements which are used to identify and detect the leading edge of the shadow and the trailing edge of the shadow as determined from the detector array and to provide signals to the component placement machine indicating the adjustments necessary to put the component in the correct angular orientation and the correct X,Y location on the circuit board or work piece.

Referring now to FIG. 11, a block diagram is shown of the processing means 200 used to signal the correction for angular orientation and lateral position. The rotary motor 41 which rotates the quill is mechanically coupled to an angular position encoder and monitor 43 which provides the angular orientation of the quill 24 position and thus the component part 30 to a processor 202. Prior to calculating a component X,Y location, the X,Y location of the quill 24 is located by inserting the quill 24 alone into the laser beam for precise centering. Thereafter, the sensed X,Y location of the component 30 edges is compared to the center of the quill 24 for purposes of precisely placing the component 80 on the circuit board 34. Similarly, the angular position encoder 43 is initially calibrated to 0 degrees angle deviation.

Since it is an objective of the invention to obtain precise angular orientation and lateral position within a few hundred milliseconds, all processing is done at a very high rate of speed. For example, in a preferred embodiment, the pixel clock and array timing 204 speed is at a five megahertz read rate. The pixel clock or count 206 which indicates which sensor element is being read is connected to an analog to digital converter 208 and to a leading shadow edge discriminator 210 and a trailing shadow edge discriminator 212. As described above, the discriminator can be a voltage comparator 130 comparing the data reading with a threshold voltage $V_{TH}$ and the same voltage comparator can be used to discriminate both the leading shadow edge and the trailing shadow edge.

The pixel clock and array timing 204 is also connected to the photo detector array 65 for purposes of reading the data from the photo detector elements. All data from the analog digital converter 208 is connected to the leading shadow edge data buffer 214 for both temporary and permanent storage when the shadow edge is detected. At the time that the leading shadow edge discriminator 210 detects data which falls below the threshold voltage $V_{TH}$, the leading edge is indicated and is connected to the leading shadow edge data buffer 214 as a latch signal 220 to store the data 80 which is relevant to the leading edge 110. In addition, the leading edge detect signal 224 is also connected to the trailing shadow edge discriminator and data buffer 228 to enable it to detect and store in a similar manner the data 80 when detected for the trailing edge 112. The buffered data is then connected to the processing unit 202 to perform the calculation to the processing unit 202 to perform the calculations for angle orientation and X,Y lateral position.

The output 230 of the processor 202 indicating where angular orientation is aligned is then connected to the component placement machine to assure precise angular orientation when the component 30 is placed on the circuit board 34. In a similar manner, the X,Y location of the edges of the component 30 are compared to the precise center of the quill 24 and this second signal 235 is also connected to the component placement machine to establish the necessary offset in one or both directions for purposes of precise placement of the component 30 on the circuit board 34.

The following table shows the approximate time and extremely high resolution which can be achieved using the invention in less than 300 milliseconds when picking up the part and checking proper alignment, both angular alignment and lateral position in both orthogonal directions.

TABLE I

| | Action | Time | Angular Resolution |
|---|---|---|---|
| (1) | Pick up. | | |
| (2) | Rotate to −5°. | 32 ms | No data collected. |
| (3) | Accelerate from −5° to +45°. Read data while going from −5° to +5°. | 73 ms | 0.43° |
| (4) | Decelerate from 45° to 95°. Read data in 85° to 95° interval. | 73 ms | 0.43° |
| (5) | Assume component alignment was found to be at approximately 85.5°. Alignment is known to within ±0.43, so a 1" wide zone centered on 85.5 should be searched at lower rotational speed to achieve 0.03°. | | |
| (6) | Rotate from 95° to 86° at high speed. | 44 ms | |
| (7) | Rotate from 86° to 85° at maximum angular velocity of 43°/sec so that 0.03° resolution is obtained. | 23 ms | 0.03° |
| | TOTAL | 245 ms | |

Since the processing speed is much faster than limitation on mechanical movement, the angular position signal 230 and the X,Y location signal 235 can be rapidly and precisely calculated and fed to the component placement machine for precise and accurate placement of the component 30 in its proper position on the circuit board 34.

Figure 12A:
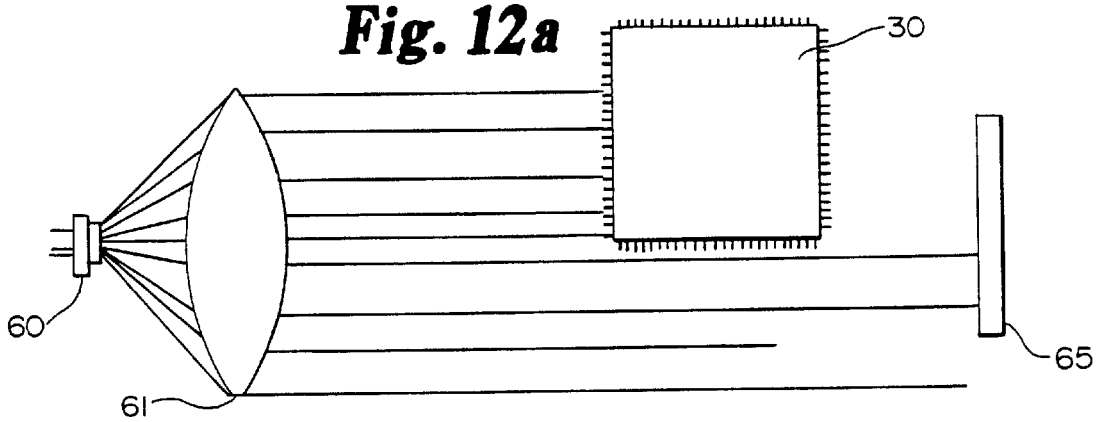
FIGS. 12a, 12b, and 12c illustrate how other part sizes can be analyzed by the sensor system.
Figure 12B:
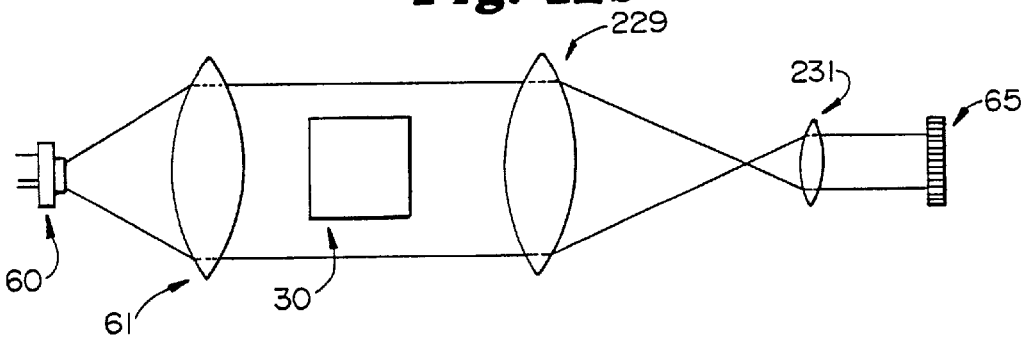
Figure 12C:
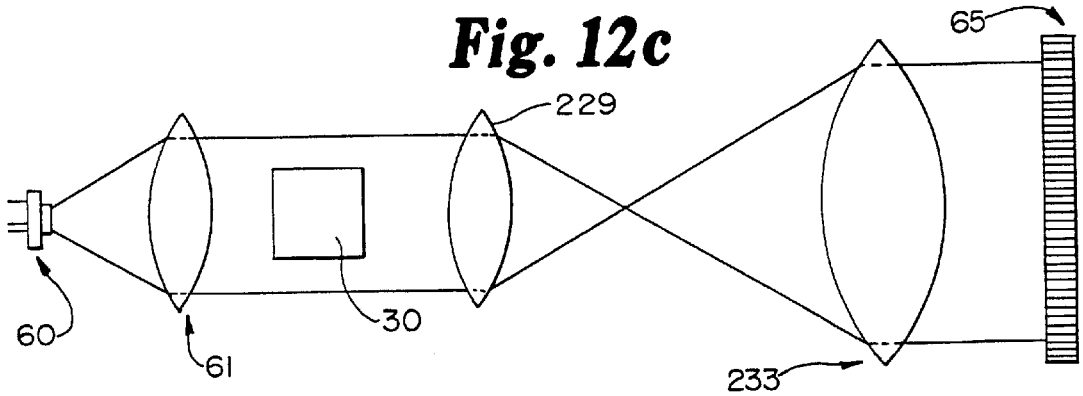

As shown in FIG. 12a, larger parts 30 can by accommodated by the system by scanning three of the four sides of the component 30 rotating the component 30 through 270 degrees in 90° intervals. FIGS. 12b and 12c show how additional optics can be used. In FIG. 12b the image 90 cast by a larger part is reduced by two lens 229, 231. Similarly, as shown in FIG. 12c higher resolution can be achieved with similar lens, 229, 231 by expanding the image on the photo detector array 65.

Using the foregoing embodiments, methods and processes, a very fast high resolution sensing system is achieved which can precisely locate a component for placement of that component on circuit boards which are within the requirements of today's technology. It will be clear to those skilled in the art that many and varied modifications and variations can be made in the specific embodiment shown and described such as use of an area array instead of a linear array, or even using the same methods or algorithms in conjunction with a TV camera. All such variations and modifications are intended to be within the scope of the appended claims.

Having described our invention, we claim:

1. A laser based high precision high speed component alignment sensor system comprising:

a single laser light source;

a collimating lens;

a multi-element sensor array having a large plurality of detector elements for detecting the light passing the component and the shadow cast by the component on the sensor array;

processing means for calculating angular and coordinate position of the component by determining the location of a plurality of data points which represent each edge of the shadow cast by the component on the sensor array, capturing only a plurality of data points which fall within or near the shadow of each edge of the component and analyzing only the data representing edges of the shadow cast by the component on the sensor array from the sensor array, said processing means comprising:

means for detecting and analyzing the trailing edge of the shadow;

means for detecting and analyzing the trailing edge of the shadow; and means for calculating component position based on the position of the leading and trailing edges of a shadow cast by the component;

first signaling means connected to the processing means for indicating the angular orientation of the component; and second signaling means connected from the processing means for indicating the coordinate position of the component.

2. The laser sensor system of claim 1 wherein the laser light source is a laser diode.

3. The laser sensor system of claim 2 wherein the laser diode is a broad spectrum laser diode.

4. The laser sensor system of claim 1 wherein an optical filter is interposed immediately prior to the sensor array to prevent ambient light from striking the sensor array.

5. The laser sensor of claim 1 wherein the collimating lens is a means for creating a stripe of laser light.

6. The laser sensor system of claim 5 wherein the component comprises leads and wherein the stripe of laser light is passed across the leads of the component.

7. The laser sensor of claim 1 further comprising a slit aperture for creating a stripe of laser light.

8. The laser sensor system of claim 7 wherein the component further comprises leads and wherein the stripe of laser light is passed across the leads of the component.

9. The laser sensor of claim 1 further comprising at least one reflecting means interposed between the light source and the sensor array for extending the focal length of the light from the laser light source.

10. The laser sensor of claim 1 wherein the processing means further comprises means for converting the data to a digital representation comparing the data with a threshold voltage.

11. In a surface mount component placement machine having means for picking up a semiconductor component, a means for directly transporting the component to a work piece, a means for rotating the component and means for accurately placing the component on the work piece, the improvement comprising:

a high precision high speed laser sensor comprising:

a single laser light source;

a collimating lens for directing the laser light past the component;

a multi-element sensor array for collecting data points relating to the angular orientation and lateral position of the component; and processing means for determining the location of a plurality of data points which represent each edge of the shadow cast by the component on the sensor array, capturing only a plurality of data points which fall within or near the shadow of each edge of the component and analyzing the data from the sensor array relating only to a leading edge and trailing edge of the shadow cast by the component onto the sensor array to determine the angular orientation and lateral position of the component; and mounting means for mounting the sensor directly onto the means for transporting the component to the work piece.

12. The laser sensor of claim 11, wherein the laser sensor further comprises lens means interposed between the component and the multi-element sensor array for magnifying the image of the shadow cast by the semiconductor component so that the shadow cast by the component onto the sensor array covers substantially all of the sensor array elements but does not exceed the lateral extent of the sensor array.

13. The laser sensor of claim 11, wherein the laser sensor further comprises lens means interposed between the component and the multi-element sensor array for reducing the image of the shadow cast by the semiconductor component so that the shadow cast by the component onto the sensor array covers substantially all of the sensor array elements but does not exceed the lateral extend of the sensor array.

14. A method for aligning a component carried by a surface mount component placement machine having a vacuum quill comprising:

picking up the component with the vacuum quill;

providing a stripe of collimated laser light;

providing a photo element array in the path of the laser light;

retracting the component into the stripe of collimated laser light so that it casts a shadow on the photo element array;

rotating the component;

detecting the leading edge and the trailing edge of the shadow cast upon the sensor array;

capturing a plurality of data points which relate to each of the leading edge and the trailing edge of the shadow;

calculating angular orientation based on the minimum shadow position using the captured leading edge and the trailing edge data; and comparing the lateral position of the leading edge and trailing edge of the shadow with the center of the quill to determine the lateral position of the component as carried by the quill.

15. A laser sensor comprising a laser light source and a sensor array for use in precisely placing a semiconductor component having various edges carried on a transport means, the transport means having control means connected to the transport means for causing the semiconductor component to be interposed between the laser light source and the sensor array and for incrementally rotating the semiconductor component to cause variation in the position of the shadow cast by at least one edge associated with the semiconductor component on the array as the semiconductor component is rotated, the sensor comprising:

a monolithic multi-element sensor array;

a single laser light source with a short coherence length directed toward the sensor array;

collimating means interposed between the laser light source and the semiconductor component for providing a single, continuous, uninterrupted, collimated stripe of laser light;

means for reading the voltages from each element of the sensor array caused by light striking each element of the multi-element sensor array; and means for determining the position of at least one edge associated with the semiconductor component as it is rotated under control of the control means by determining the location of a plurality of data points which represent at least one edge of the shadow cast by the component on the sensor array, capturing only a plurality of data points which fall within or near the shadow the one edge of the component and analyzing only the data representing the edge of the shadow cast by the component on the sensor array from the sensor array, said determining means comprising:

means for generating a reference threshold voltage which is less than the voltage output from any element in the array upon which light falls and greater than the voltage output from any element falling fully within the shadow cast by the component on the array;

means for comparing the voltages from each element of the multi-element sensor array with the reference threshold voltage after each incremental rotation;

means for identifying the edge of the shadow when the voltage reading on any element equals the threshold voltage;

means for determining after each incremental rotation whether the shadow is narrower by comparing the position of the edge of the shadow on the array as determined by the identifying means from successive readings of the voltages of each element as the component is rotated;

means for capturing data which relates only to the edge of the shadow when the shadow is determined to be the narrowest shadow; and means for processing the captured data to precisely determine the location of the edge of the semiconductor component and for calculating the angular orientation and the lateral position of the semiconductor.

16. The laser sensor of claim 15, wherein the sensor locates the edge of at least one side of a four-sided semiconductor component.

17. The sensor of claim 15, wherein the sensor precisely locates two opposing sides of the semiconductor component.

18. The laser sensor of claim 15, wherein the sensor determines at least one edge of at least one lead of the semiconductor component.

19. The detector of claim 15, wherein the laser sensor detects each edge of each lead of the semiconductor component.

20. The semiconductor component of claim 19, wherein the laser sensor detects each leading edge and each trailing edge of each lead of the semiconductor component.

21. A method of orienting a semiconductor component carried on a transport means, the method comprising:

providing a collimated stripe of laser light directed toward the component;

providing a multi-element semiconductor array having a plurality of cell locations, the array being positioned on the side of the component opposite the laser light source so that the shadow of the component is cast upon the multi-element array;

causing the component to be incrementally rotated;

repetitively reading the voltages in multiple scans from each element of the sensor array and for each scan of the voltages;

reading the voltages on each cell of the array;

comparing the voltages to a threshold voltage;

temporarily storing a plurality of voltage readings as data points which represent each edge of the shadow for purposes of determining each edge position of the component; and recording the cell locations where a transition occurs above and below the threshold voltage as the location of the leading edge and the trailing edge of the shadow;

comparing the cell locations where each edge of the shadow was detected for each scan to determine the narrowest shadow width;

capturing only data relating to the edge location when the shadow is the narrowest; and processing the captured data to determine the lateral position and angular orientation of the semiconductor component.

22. The method of claim 21, wherein the step of comparing cell locations to determine the narrowest shadow comprises identifies the last cell of the plurality of cell locations where the voltage falls below the threshold voltage;

the step of capturing data relating to the edge location when the shadow is narrowest comprises, for the leading edge of the shadow, determining the last cell on the leading edge where the voltage falls below the threshold voltage and determining when the voltage on the last cell exceeds the threshold voltage; and wherein the step of processing the captured data comprises calculating the edge of the shadow as the point mid-way between the two data points.

23. The method of claim 21, wherein the step of comparing cell locations to determine the narrowest shadow comprises identifies the last cell of the plurality of cell locations where the voltage exceeds the threshold voltage;

the step of capturing data relating to the edge location when the shadow is narrowest comprises, for the trailing edge of the shadow, determining the last cell on the trailing edge where the voltage exceeds the threshold voltage and determining when the voltage on the last cell falls below the threshold voltage; and wherein the step of processing the captured data comprises calculating the edge of the shadow as the point mid-way between the two data points.

24. The method of claim 21, wherein the narrowest shadow width is detected, a limited plurality of data points are captured which immediately preceed and immediately follow the detection of the edges of the narrowest shadow and wherein the processing means analyzes the limited plurality of data readings to determine the precise edge locations of the shadow.

25. A method for determining the proper lateral and angular orientation of a component interposed between a laser light source and a multi-element photo detector array, each element comprising a pixel, comprising:

providing a collimated stripe of laser light directed toward the component;

establishing a reference voltage threshold which is less than the voltage [ouput] *output* from any pixel in the array upon which light falls and greater than the voltage output from any pixel falling fully within the shadow;

incrementally rotating the quill and the component about a vertical axis;

reading voltages on each pixel of the array after each incremental rotation;

comparing the voltages against the reference voltage threshold;

storing the data voltage readings of a first edge pixel at a pixel count whose voltage first drops below the reference voltage threshold and of a second edge pixel at a higher pixel count whose voltage again rises above the reference voltage threshold;

determining after each incremental rotation whether the first edge pixel is at a higher pixel count than the previously stored edge pixel thereby indicting that the shadow is still narrowing;

capturing the data if the first edge pixel is at a lower pixel count than the immediately preceding stored first edge pixel which indicates that the shadow is the narrower; and processing the captured data when the shadow is narrowest to determine the lateral position and angular orientation of the component.

*26. A high precision high speed component alignment sensor system comprising:*

*a short coherence length source;*

*a collimating lens;*

*a multi-element sensor array having a large plurality of detector elements for detecting the light passing the component and the shadow cast by the component on the sensor array;*

*processing means for calculating angular and coordinate position of the component by determining the location of a plurality of data points which represent each edge of the shadow cast by the component on the sensor array, capturing only a plurality of data points which fall within or near the shadow of each edge of the component and analyzing only the data representing edges of the shadow cast by the component on the sensor array from the sensor array, said processing means comprising:*

*means for detecting and analyzing the leading edge of the shadow;*

*means for detecting and analyzing the trailing edge of the shadow; and*

*means for calculating component position based on the position of the leading and trailing edges of a shadow cast by the component;*

*first signaling means connected to the processing means for indicating the angular orientation of the component; and*

*second signaling means connected to the processing means for indicating the coordinate position of the component.*

*27. A surface mount component placement machine having means for picking up an electrical component, a means for directly transporting the component to a work piece, a means for rotating the component and means for accurately placing the component on the work piece, the improvement comprising:*

*a high precision, high speed sensor comprising:*

*a short coherence length light source;*

*a collimating lens for directing the light past the component;*

*a multi-element sensor array for collecting data points relating to the angular orientation and lateral position of the component; and*

*processing means for determining the location of a plurality of data points which represent each edge of the shadow cast by the component on the sensor array, capturing only a plurality of data points which fall within or near the shadow of each edge of the component and analyzing the data from the sensor array relating only to a leading edge and trailing edge of the shadow cast by the component onto the sensor array to determine the angular orientation and lateral position of the component; and*

*mounting means for mounting the sensor directly onto the means for transporting the component to the work piece.*

*28. A method for aligning a component carried by a surface mount component placement machine having a vacuum quill comprising:*

*picking up the component with the vacuum quill;*

*providing a stripe of collimated light from a short coherence length source;*

*providing a photo element array in the path of the light;*

*retracting the component into the stripe of collimated light so that it casts a shadow on the photo element array;*

*rotating the component;*

*detecting a leading edge and a trailing edge of the shadow cast upon the sensor array;*

*capturing a plurality of data points which relate to each of the leading edge and the trailing edge of the shadow;*

*calculating angular orientation based on the minimum shadow position using the captured leading edge and the trailing edge data; and*

*comparing the lateral position of the leading edge and trailing edge of the shadow with the center of the quill to determine the lateral position of the component as carried by the quill.*

*29. A sensor comprising a short coherence length source and a sensor array for use in precisely placing an electrical component having various edges carried on a transport means, the transport means having control means connected to the transport means for causing the electrical component to be interposed between the short coherence length source and the sensor array and for incrementally rotating the electrical component to cause variation in the position of the shadow cast by at least one edge associated with the electrical component on the array as the electrical component is rotated, the sensor comprising:*

*a monolithic multi-element sensor array;*

*a short coherence length source;*

*collimating means interposed between the short coherence length source and the electrical component for providing a continuous, uninterrupted, collimated stripe of light;*

*means for reading the voltages from each element of the sensor array caused by light striking each element of the multi-element sensor array; and*

*means for determining the position of at least one edge associated with the electrical component as it is rotated under control of the control means by determining the location of a plurality of data points which represent at least one edge of the shadow cast by the component on the sensor array, capturing only a plurality of data points which fall within or near the shadow of the at least one edge of the component and analyzing only the data representing the edge of the shadow cast by the component on the sensor array from the sensor array, said determining means comprising:*

*means for generating a reference threshold voltage which is less than the voltage output from any element in the array upon which light falls and greater than the voltage output from any element falling fully within the shadow cast by the component on the array;*

*means for comparing the voltages from each element of the multi-element sensor array with the reference threshold voltage after each incremental rotation;*

*means for identifying the edge of the shadow when the voltage reading on any element equals the threshold voltage;*

*means for determining after each incremental rotation whether the shadow is narrower by comparing the position of the edge of the shadow on the array as*

*determined by the identifying means from successive readings of the voltages of each element as the component is rotated;*

*means for capturing data which relates only to the edge of the shadow when the shadow is determined to be the narrowest shadow; and*

*means for processing the captured data to precisely determine the location of the edge of the electrical component and for calculating the angular orientation and the lateral position of the component.*

*30. A method of orienting an electrical component carried on a transport means, the method comprising:*

*providing a collimated stripe of light, from a short coherence length source, directed toward the electrical component;*

*providing a multi-element sensor array having a plurality of cell locations, the array being positioned on the side of the component opposite the short coherence length source so that the shadow of the component is cast upon the multi-element array;*

*causing the component to be incrementally rotated;*

*repetitively reading the voltages in multiple scans from each element of the sensor array and for each scan of the voltages;*

*reading the voltage on each cell of the array;*

*comparing the voltages to a threshold voltage;*

*temporarily storing a plurality of voltage readings as data points which represent each edge of the shadow for purposes of determining each edge position of the component; and*

*recording the cell locations where a transition occurs above and below the threshold voltage as the location of the leading edge and the trailing edge of the shadow;*

*comparing the cell locations where each edge of the shadow was detected for each scan to determine the narrowest shadow width;*

*capturing only data relating to the edge location when the shadow is narrowest; and*

*processing the captured data to determine the lateral position and angular orientation of the electrical component.*

*31. A method for determining the proper lateral and angular orientation of component interposed between a short coherence length source and a multi-element photo detector array, each element comprising a pixel, comprising;*

*providing a collimated stripe of light from a short coherence length source directed toward the component;*

*establishing a reference voltage threshold which is less than the voltage output from any pixel in the array upon which light falls and greater than the voltage output from any pixel falling fully within the shadow;*

*incrementally rotating the quill and the component about a vertical axis;*

*reading voltages on each pixel of the array after each incremental rotation;*

*comparing the voltages against the reference voltage threshold;*

*storing the data voltage readings of a first edge pixel at a pixel count whose voltage first drops below the reference voltage threshold and of a second edge pixel at a higher pixel count whose voltage again rises above the reference voltage threshold;*

*determining after each incremental rotation whether the first edge pixel is at a higher pixel count than the previously stored edge pixel thereby indicating that the shadow is still narrowing;*

*capturing the data if the first edge pixel is at a lower pixel count than the immediately preceding stored first edge pixel which indicates that the shadow is narrower; and*

*processing the captured data when the shadow is narrowest to determine the lateral position and angular orientation of the component.*

*32. A laser based high precision high speed component alignment sensor system comprising:*

*a single laser light source;*

*a collimating lens;*

*a multi-element sensor array having a large plurality of detector elements for detecting the light passing the component and the shadow cast by the component on the sensor array;*

*a processor for calculating angular and coordinate position of the component by determining the location of a plurality of data points which represent each edge of the shadow cast by the component on the sensor array, capturing only a plurality of data points which fall within or near the shadow of each edge of the component and analyzing only the data representing edges of the shadow cast by the component on the sensor array from the sensor array, said processor detecting and analyzing the leading edge of the shadow, detecting and analyzing the trailing edge of the shadow, and calculating component position based on the position of the leading and trailing edges of a shadow cast by the component;*

*a first signaling device connected to the processor for indicating the angular orientation of the component; and*

*a second signaling device connected from the processor for indicating the coordinate position of the component.*

*33. In a surface mount component placement machine having a pickup device for picking up a semiconductor component, a transport device for directly transporting the component to a work piece, a rotation device for rotating the component and a placement device for accurately placing the component on the work piece, the improvement comprising:*

*a high precision high speed laser sensor comprising:*

*a single laser light source;*

*a collimating lens for directing the laser light past the component;*

*a multi-element sensor array for collecting data points relating to the angular orientation and lateral position of the component; and*

*a processor for determining the location of a plurality of data points which represent each edge of the shadow cast by the component on the sensor array, capturing only a plurality of data points which fall within or near the shadow of each edge of the component and analyzing the data from the sensor array relating only to a leading edge and trailing edge of the shadow cast by the component onto the sensor array to determine the angular orientation and lateral position of the component; and*

*a mounting device for mounting the sensor directly onto the transport device.*

*34. A method of orienting a semiconductor component, the method comprising:*

*providing a collimated stripe of laser light directed toward the component;*

*providing a multi-element semiconductor array having a plurality of cell locations, the array being positioned on the side of the component opposite the laser light source so that the shadow of the component is cast upon the multi-element array;*

*causing the component to be incrementally rotated;*

*repetitively reading the voltages in multiple scans from each element of the sensor array and for each scan of the voltages;*

*reading the voltages on each cell of the array;*

*comparing the voltages to a threshold voltage;*

*temporarily storing a plurality of voltage readings as data points which represent each edge of the shadow for purposes of determining each edge position of the component; and*

*recording the cell locations where a transition occurs above and below the threshold voltage as the location of the leading edge and the trailing edge of the shadow;*

*comparing the cell locations where each edge of the shadow was detected for each scan to determine the narrowest shadow width;*

*capturing only data relating to the edge location when the shadow is the narrowest; and*

*processing the captured data to determine the lateral position and angular orientation of the semiconductor component.*

*35. A high precision high speed component alignment sensor system comprising:*

*a short coherence length source;*

*a collimating lens;*

*a multi-element sensor array having a large plurality of detector elements for detecting the light passing the component and the shadow cast by the component on the sensor array;*

*a processor for calculating angular and coordinate position of the component by determining the location of a plurality of data points which represent each edge of the shadow cast by the component on the sensor array, capturing only a plurality of data points which fall within or near the shadow of each edge of the component and analyzing only the data representing edges of the shadow cast by the component on the sensor array from the sensor array, said processor: detecting and analyzing the leading edge of the shadow, detecting and analyzing the trailing edge of the shadow, and calculating component position based on the position of the leading and trailing edges of a shadow cast by the component;*

*a first signaling device connected to the processor for indicating the angular orientation of the component; and*

*a second signaling device connected to the processor for indicating the coordinate position of the component.*

*36. A surface mount component placement machine having a pickup for an electrical component, a transporter for directly transporting the component to a work piece, rotating the component and accurately placing the component on the work piece, the improvement comprising:*

*a sensor, the sensor comprising:*

*a short coherence length light source;*

*a collimating lens for directing the light past the component;*

*a multi-element sensor array for collecting data points relating to the angular orientation and lateral position of the component; and*

*a processor for determining the location of a plurality of data points which represent each edge of the shadow cast by the component on the sensor array, capturing only a plurality of data points which fall within or near the shadow of each edge of the component and analyzing the data from the sensor array relating only to a leading edge and trailing edge of the shadow cast by the component onto the sensor array to determine the angular orientation and lateral position of the component.*

*37. A method of orienting an electrical component, the method comprising:*

*providing a collimated stripe of light, from a short coherence length source, directed toward the electrical component;*

*providing a multi-element sensor array having a plurality of cell locations, the array being positioned on the side of the component opposite the short coherence length source so that the shadow of the component is cast upon the multi-element array;*

*causing the component to be incrementally rotated;*

*repetitively reading the voltages in multiple scans from each element of the sensor array and for each scan of the voltages;*

*reading the voltage on each cell of the array;*

*comparing the voltages to a threshold voltage;*

*temporarily storing a plurality of voltage readings as data points which represent each edge of the shadow for purposes of determining each edge position of the component; and*

*recording the cell locations where a transition occurs above and below the threshold voltage as the location of the leading edge and the trailing edge of the shadow;*

*comparing the cell locations where each edge of the shadow was detected for each scan to determine the narrowest shadow width;*

*capturing only data relating to the edge location when the shadow is narrowest; and*

*processing the captured data to determine the lateral position and angular orientation of the electrical component.*

*38. A method for determining the proper lateral orientation of a component carried by a surface mount component placement machine having a quill, where the quill is interposed between a short coherence length source and a multi-element photo detector array, each element comprising a pixel, the method comprising the steps of:*

*providing a collimated stripe of light from a short coherence length source directed toward the component;*

*rotating the quill and the component about a vertical axis;*

*reading voltages from the pixels of the array during the rotation;*

*identifying edges of the component;*

*capturing the data from the detector only at and near the portions of the detector corresponding to the edges of the component, said voltages from the pixels in said portions being both above and below a threshold voltage level; and*

*processing the captured data to determine the lateral position of the component.*

*39. A method of orienting a component by angularly rotating the component through a plurality of angles so as to cast a shadow of the component onto a detector, the method comprising:*

*reading sets of data from the detector as the component rotates through the angles, each set of data corresponding to one of the angles;*

*analyzing a leading edge and a trailing edge of each of the sets of data to locate one set having a minimum shadow width; and*

*outputting the angle corresponding to the minimum shadow width.*

*40. The method of claim 39, wherein the shadow is formed by collimated light.*

*41. The method of claim 40, wherein the shadow cast onto the detector includes at least a portion of leads on the component.*

*42. The method of claim 39, wherein a processor uses the angle to compute a width and position of the component.*

*43. Apparatus for orienting a component, the apparatus comprising:*

*a detector;*

*a rotation device constructed to angularly rotate the component through a plurality of angles so as to cast a shadow of the component onto the detector; and*

*a processing device constructed to read sets of data from the detector as the component rotates through the angles, each set of data corresponding to one of the angles, the processing device capturing only a plurality of data points which fall within or near the shadow edge of the component and analyzing data from the detector relating only to a leading edge and trailing edge of each of the sets of data to locate one set having a minimum shadow width, the processing device outputting the angle corresponding to the minimum shadow width.*

*44. The apparatus of claim 43, wherein the shadow is formed by collimated light.*

*45. The apparatus of claim 44, wherein the shadow cast onto the detector includes at least a portion of leads on the component.*

*46. The apparatus of claim 43, wherein the processing device uses the angle to compute a width and position of the component.*

*47. A method of orienting a component by angularly rotating the component through a plurality of angles so as to cast a shadow of the component onto a detector, the method comprising:*

*collimating light to form a stripe on the detector;*

*reading sets of data from the detector as the component rotates through the angles, each set of data corresponding to one of the angles;*

*analyzing the sets of data to locate one set having a minimum shadow width; and*

*reporting the angle corresponding to the minimum shadow width.*

*48. Apparatus for orienting a component, the apparatus comprising:*

*a detector;*

*a rotation device constructed to angularly rotate the component through a plurality of angles so as to cast a shadow of the component onto the detector;*

*a collimating device constructed to form a stripe of light on the detector; and*

*a processing device constructed to read sets of data from the detector as the component rotates through the angles, each set of data corresponding to one of the angles, the processing device analyzing the sets of data to locate one set having a minimum shadow width, the processing device reporting the angle corresponding to the minimum shadow width.*

*49. A method of orienting a component by angularly rotating the component through a plurality of angles, the method comprising:*

*casting a first and second shadow of the component onto a first and a second detector, the detectors oriented orthogonally with respect to each other;*

*reading data from the first and second detectors into a first and a second group of data, the first group including data from the first detector and the second group including data from the second detector, and repeating the aforementioned steps at the plurality of angles;*

*selecting sets of data corresponding to a minimum shadow width from each of the two groups, the selection of sets of data performed as a function of a leading edge and a trailing edge on each of the sets of data; and*

*reporting two angles from the plurality of angles, each reported angle corresponding to selected data having the minimum shadow width.*

*50. Apparatus for orienting a component, the apparatus comprising:*

*a first detector and a second detector oriented orthogonally with respect to each other, a first shadow and a second shadow of the component being cast onto the first detector and the second detector, respectively;*

*a rotation device constructed to angularly rotate the component through a plurality of angles; and*

*a processing device constructed to read data from the first detector and the second detector into a first group of data and a second group of data, the first group including data from the first detector and the second group including data from the second detector; further wherein the casting of shadows and the reading of data into groups is repeated at the plurality of angles, the processing device further selecting sets of data corresponding to a minimum shadow width from each of the two groups, the selection of sets of data performed as a function of a leading edge and a trailing edge on each of the sets of data, the processing device reporting two angles from the plurality of angles, each of the reported angles corresponding to selected data having the minimum shadow width.*

*51. A method of orienting a component by angularly rotating the component through a plurality of angles so as to cast a shadow of the component onto a detector, the method comprising:*

*reading sets of data from the detector as the component rotates through the angles, each set of data corresponding to one of the angles;*

*identifying an edge pixel in the sets of data, the edge pixel representative of a shadow intensity at the edge pixel, and storing one of the angles corresponding to a maximum value of the intensity of the edge pixel; and*

*reporting the orientation of the component as a function of the angle.*

*52. Apparatus for orienting a component, the apparatus comprising:*

*a detector;*

*a rotation device constructed to angularly rotate the component through a plurality of angles so as to cast a shadow of the component onto the detector; and*

*a processing device constructed to read sets of data from the detector as the component rotates through the*

*angles, each set of data corresponding to one of the angles, the processing device identifying an edge pixel in the sets of data, the edge pixel representative of a shadow intensity at the edge pixel, the processing device storing one of the angles corresponding to a maximum value of the intensity of the edge pixel, the processing device reporting the orientation of the component as a function of the angle.*

*53. A method of orienting a component by angularly rotating the component through a plurality of angles so as to cast a shadow of the component onto a detector, the method comprising:*

*reading sets of data from the detector as the component rotates through the angles, each set of data corresponding to one of the angles;*

*thresholding the sets of data so as to identify at least a pair of zero crossings of the set of data with the threshold, and identifying a component width as a function of a distance between the pair of zero crossings, and*

*selecting the set of data having the minimum distance between the zero crossings.*

*54. Apparatus for orienting a component, the apparatus comprising:*

*a detector;*

*a rotation device constructed to angularly rotate the component through a plurality of angles so as to cast a shadow of the component onto the detector; and*

*a processing device constructed to read sets of data from the detector as the component rotates through the angles, each set of data corresponding to one of the angles, the processing device thresholding the sets of data so as to identify at least a pair of zero crossings of the set of data with the threshold, the processing device identifying a component width as a function of a distance between the pair of zero crossings, the processing device selecting the set of data having the minimum distance between the zero crossings.*

* * * * *